United States Patent
Rohrbaugh et al.

(10) Patent No.: US 7,139,955 B2
(45) Date of Patent: Nov. 21, 2006

(54) HIERARCHICALLY-CONTROLLED AUTOMATIC TEST PATTERN GENERATION

(75) Inventors: John G Rohrbaugh, Ft Collins, CO (US); Jeff Rearick, Ft Collins, CO (US)

(73) Assignee: Avago Technologies General IP (singapore) Pte. Ltd., Singapore (SG)

( * ) Notice: Subject to any disclaimer, the term of this patent is extended or adjusted under 35 U.S.C. 154(b) by 895 days.

(21) Appl. No.: 10/321,758

(22) Filed: Dec. 17, 2002

(65) Prior Publication Data

US 2004/0153928 A1 Aug. 5, 2004

(51) Int. Cl.
  *G06F 11/00* (2006.01)
  *G06F 17/50* (2006.01)
  *G06F 7/62* (2006.01)
(52) U.S. Cl. .......................... 714/738; 703/13
(58) Field of Classification Search ...................... None
  See application file for complete search history.

(56) References Cited

U.S. PATENT DOCUMENTS

| | | | |
|---|---|---|---|
| 5,381,344 A | 1/1995 | Rohrbaugh et al. | |
| 5,390,131 A | 2/1995 | Rohrbaugh et al. | |
| 5,400,263 A | 3/1995 | Rohrbaugh et al. | |
| 5,495,578 A | 2/1996 | Rohrbaugh et al. | |
| 5,831,996 A | 11/1998 | Abramovici et al. | |
| 5,905,986 A | 5/1999 | Rohrbaugh et al. | |
| 6,070,261 A | 5/2000 | Tamarapalli et al. | |
| 6,178,533 B1 * | 1/2001 | Chang | 714/739 |
| 6,234,689 B1 | 5/2001 | Rohrbaugh et al. | |
| 6,370,677 B1 * | 4/2002 | Carruthers et al. | 716/8 |
| 6,396,312 B1 | 5/2002 | Shepston et al. | |
| 6,607,651 B1 | 8/2003 | Stiller | |
| 6,883,128 B1 * | 4/2005 | Kang et al. | 714/738 |

OTHER PUBLICATIONS

Kim, et al., "Sequential Test Generators: Past, Present and Future," Department of Electrical and Computer Engineering, University of Wisconsin, Madison, WI 53706, Jul. 2, 1998, Revised Jul. 23, 1998.
Dr. Daniel C. Hyde, CSCI 320 Computer Architecture Handbook on Verilog HDL,: Computer Science Department, Bucknell University, Lew isburg, PA 17837, Aug. 25, 1995, Updated Aug. 23, 1997.

* cited by examiner

*Primary Examiner*—Christine T. Tu

(57) ABSTRACT

Hierarchically-controlled automatic test pattern generation (ATPG) is provided. One embodiment comprises a method for automatically generating test patterns for testing a device under test. Briefly described, one such method comprises the steps of: receiving a hierarchical model of a device under test, the hierarchical model comprising at least one low-level design component and at least one high-level design component which contains the low-level design component; selecting a fault to be detected in the device under test; and performing an automatic test pattern generation (ATPG) algorithm on the design components based on the hierarchy of the hierarchical model.

27 Claims, 7 Drawing Sheets

HIERARCHICALLY-CONTROLLED AUTOMATIC TEST PATTERN GENERATION

FIELD OF THE INVENTION

The present invention generally relates to systems and methods for providing automatic test pattern generation (ATPG).

BACKGROUND

Integrated circuits and other semiconductor and electronic products are routinely tested to ensure that they function properly before a product containing the device under test (DUT) is shipped, sold, or placed into use. Automatic test pattern generation (ATPG) systems are used to generate a set of test patterns that will efficiently test for and detect faults on the tested device. ATPG systems use a model of a device to formulate the test patterns, test vectors, etc. that may be used by automatic testing equipment (ATE) to test the DUT.

A variety of automatic test equipment (ATE) have long been known for testing electronic circuits, devices, integrated circuits, and other semiconductor and electronic products. Generally, automatic test equipment is divided into two broad categories, analog testers and digital testers. As the names imply, analog testers are generally designed for testing analog circuit devices, while digital testers are designed for testing digital circuit devices. Digital testers generally include a testing device having a number of internal circuit cards or channels that generate programmably controlled test signals for testing and evaluating a DUT. More specifically, ATE may be programmably controlled to be adapted or configured to test a variety of devices in a variety of ways. This is achieved by programming ATE inputs to inject a certain signal (or signal transition) and by programming ATE outputs to compare a value to a certain pin or signal line on a DUT. In this regard, a digital tester generally includes a test head by which electrical signals are input to and output from the tester. The test head comprises a number of connectors, each defining a channel, which may be connected via cable or otherwise to a device under test. The electronics within the digital tester may then input and output signals to/from a DUT via the test head.

By way of an extremely simple illustration, consider a digital tester that is configured to test a package containing, among other things, a two input AND gate. The digital tester may be configured to apply a logic one on the two signal lines that correspond to the inputs of the AND gate, then receive the signal on the signal line corresponding to the output to ensure that it is driven to a logic one in response. The tester may then be configured to alternatively apply logic zero signals on each of the two signal lines corresponding to the AND gate inputs, in order to verify that the output of the AND gate transitions from a logic one to a logic zero in response. If proper (i.e., expected) operation is not realized, then a defect is detected.

An integrated circuit tester includes a set of channels or "nodes", wherein one node is associated with each terminal of the DUT. When the DUT is an integrated circuit chip (IC) chip, then one channel may be associated with each pin of the IC chip. A test is organized into a set of successive time segments ("test cycles"). During any given test cycle, each channel can either transmit a test signal to the pin, sample a DUT output signal at the associated pin, or do neither. Each channel includes its own memory for storing a sequence of these transmit or sample commands ("test vectors").

As known in the art, an ATPG system is independent and distinct from a tester. An ATPG system uses a model of a DUT to formulate a set of test vectors that will efficiently test for and detect faults on the tested device. Whereas, a tester is a device disposed downstream of the test generator. It utilizes the set of test vectors generated by the test generator in order to test the actual device.

Existing ATPG solutions, however, may be problematic due to the amount of required processing time, resources, etc. Typically, during existing ATPG processes, the device model is flattened (i.e., all levels of hierarchy are removed). Then, an ATPG algorithm designates (for the entire device model) whether the particular fault being tested may be detected (i.e., whether a test pattern can be generated to detect the fault). In this regard, an ATPG algorithm typically designates a so-called fault status for each fault in the design model (e.g., "untestable fault," "undetected fault," "detected fault," etc.). During ATPG processing, if a test pattern is generated, the fault may be categorized as "detected." For instance, if the ATPG algorithm cannot generate a test pattern after all possibilities have been exhausted, the fault may be categorized as "untestable." An ATPG algorithm may also implement an abort limit in order to manage processing resources. In this manner, a fault may be categorized as "undetected" if the abort limit is reached before the ATPG algorithm is able to resolve the fault as "detected" or "untestable." If ATPG processing terminates in this way, fault coverage may be hindered because the ATPG algorithm could have generated a pattern but did not. Existing solutions require substantial processing time, resources, etc. to detect faults and/or to determine that a fault is untestable.

SUMMARY

The present invention provides hierarchical automatic test pattern generation (ATPG).

One embodiment comprises a method for automatically generating test patterns for testing a device under test. Briefly described, one such method comprises the steps of: receiving a hierarchical model of a device under test, the hierarchical model comprising at least one child block and at least one parent block which contains the child block; and performing an automatic test pattern generation (ATPG) process on the at least one child block and the at least one parent block via a post-order traversal of the hierarchical model.

Another embodiment comprises a program embodied in a computer-readable medium for automatically generating test patterns for a device under test. Briefly described, one such program comprises: logic configured to access a hierarchical model of a device under test, the hierarchical model comprising at least one child block and at least one parent block which contains the child block; and logic configured to initiate an automatic test pattern generation (ATPG) process on the at least one child block and the at least one parent block via a post-order traversal of the hierarchical model.

Another embodiment comprises an automatic test pattern generation system. Briefly described, one such ATPG system comprises: a memory containing a hierarchical model of a device under test, the hierarchical model comprising at least one child block and at least one parent block which contains the child block; and a processor device configured to perform an automatic test pattern generation (ATPG) process on the at least one child block and the at least one parent block via a post-order traversal of the hierarchical model.

Another such ATPG system comprises: means for storing a hierarchical model of a device under test, the hierarchical model comprising at least one child block and at least one parent block which contains the child block; and means for performing an automatic test pattern generation (ATPG) process on the at least one child block and the at least one parent block via a post-order traversal of the hierarchical model

BRIEF DESCRIPTION OF THE DRAWINGS

The invention can be better understood with reference to the following drawings.

DETAILED DESCRIPTION

Figure 1:
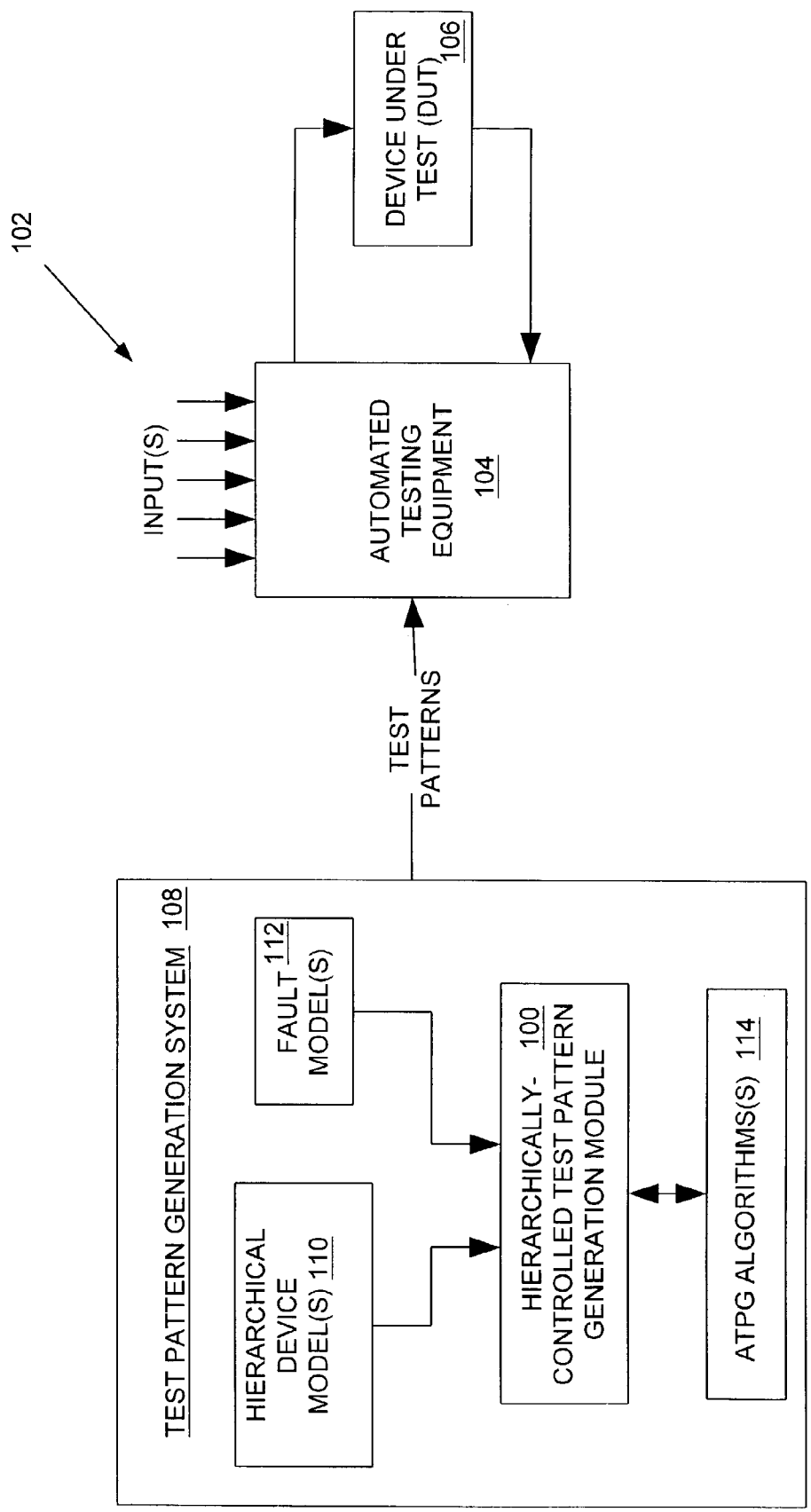
FIG. 1 is a block diagram of an automatic testing environment, which includes a hierarchically-controlled test pattern generation system according to the present invention.

FIG. 1 illustrates an automatic testing environment 102, including a hierarchically-controlled test pattern generation module 100 according to the present invention. As illustrated in FIG. 1, automatic testing environment 102 comprises automated testing equipment (ATE) 104, a device under test (DUT) 106, and an automatic test pattern generation (ATPG) system 108. In general, ATPG system 108 generates test patterns (in a manner that will be more fully described below) that are communicated to ATE 104, which may thereafter be used to test a device under test (DUT)106.

In one of a number of possible embodiments, DUT 106 comprises an integrated circuit chip, which is tested by applying input signals to one or more input pins and evaluating output signals delivered to one or more output pins. Nonetheless, one of ordinary skill in the art will appreciate that DUT 106 may comprise any type of functional circuitry. For example, DUT 106 may include sequential logic, combinational logic, and any combination thereof. Therefore, DUT 106 may also include I/O pins.

As known in the art, a comprehensive test plan for DUT 106 may include a specification of DUT 106 pins, voltage levels, timing, vectors, tests, etc. In this regard, ATPG system 108 may include hierarchical device model(s) 110, which may include data for logic and connectivity, and provide the data required for ATPG system 108 to generate, for example, in-circuit tests. Typically, a hierarchical device model 110 provides information regarding connectivity and structure of one or more devices. In addition, it specifies implied functions at a low level (such as AND, OR, and NOT, and perhaps other primitives as well).

As the name suggests, hierarchical device model 110 is designed in a hierarchical nature. For instance, in designing complex digital circuits and systems, the design usually moves through layers of abstraction from the most generally defined design to the final physical implementation. The designer usually begins by giving a behavioral description of the overall function of the desired design component. Languages used for behavioral description are often similar to computer programming languages such as Pascal or C. The behavioral description is then simulated to check for accuracy, and is modified into a structural circuit description (e.g., a netlist), which represents connections between functional cells in a device that will implement the design. One of ordinary skill in the art will appreciate that hierarchical device model(s) 110 may be written in a hardware description language (HDL), such as Verilog and Very Large Scale Integration HDL (VHDL) to recite the structural connections. Some designers prefer to begin the design process at the structural level, using schematics, register transfer schemes or structural HDL, thereby entirely bypassing the behavioral level. Next, the designer develops the physically implementable description of the design. In programmable logic, such implementable files are known as configuration data.

Because many useful digital circuit designs are extremely complex, most designers generate their designs using high level functions that are combinations of hierarchically-related subcomponents to facilitate coding and understanding. The design tools then decompose the designer's description into the hierarchically-related subcomponents for placing in DUT 106 that will implement the design. The behavioral subcomponents do not necessarily correspond to different parts of a chip or architecture that will implement the functions (e.g., shift registers in one section, addressing circuitry in another, etc.), and, in fact, are usually unrelated to physical components that implement a circuit design. Instead, behavioral subcomponents may be grouped according to function. It may be advantageous to organize a design into hierarchical components, thinking at one time about a high level design, and at other times about details of each portion of the high level design. This technique, often referred to as "divide and conquer," advantageously reduces the possibility of design errors, makes errors easier to correct, and accelerates the design process.

The divide and conquer hierarchical design technique provides an additional advantage: dividing a design into hierarchical subcomponents introduces the possibility of reusing part of the design in other designs or in other components of the same design. Using hierarchical subsystems and subcomponents works well with libraries of self-contained modules for accomplishing specified functions and provides some of the advantages found in Object Oriented Programming, such as standardizing subcomponent interfaces and simplifying the editing and substitution processes.

Hardware Description Language (HDL) tools incorporate hierarchy in a manner similar to a software program using subroutines. For instance, to represent a desired design, calls may be made to predefined procedures, which in themselves describe subsystems, and so on. With both schematic-based and HDL tools, subsystems of a design can be reused multiple times within a single design. Such reuse can be hierarchical as well.

Figure 2:
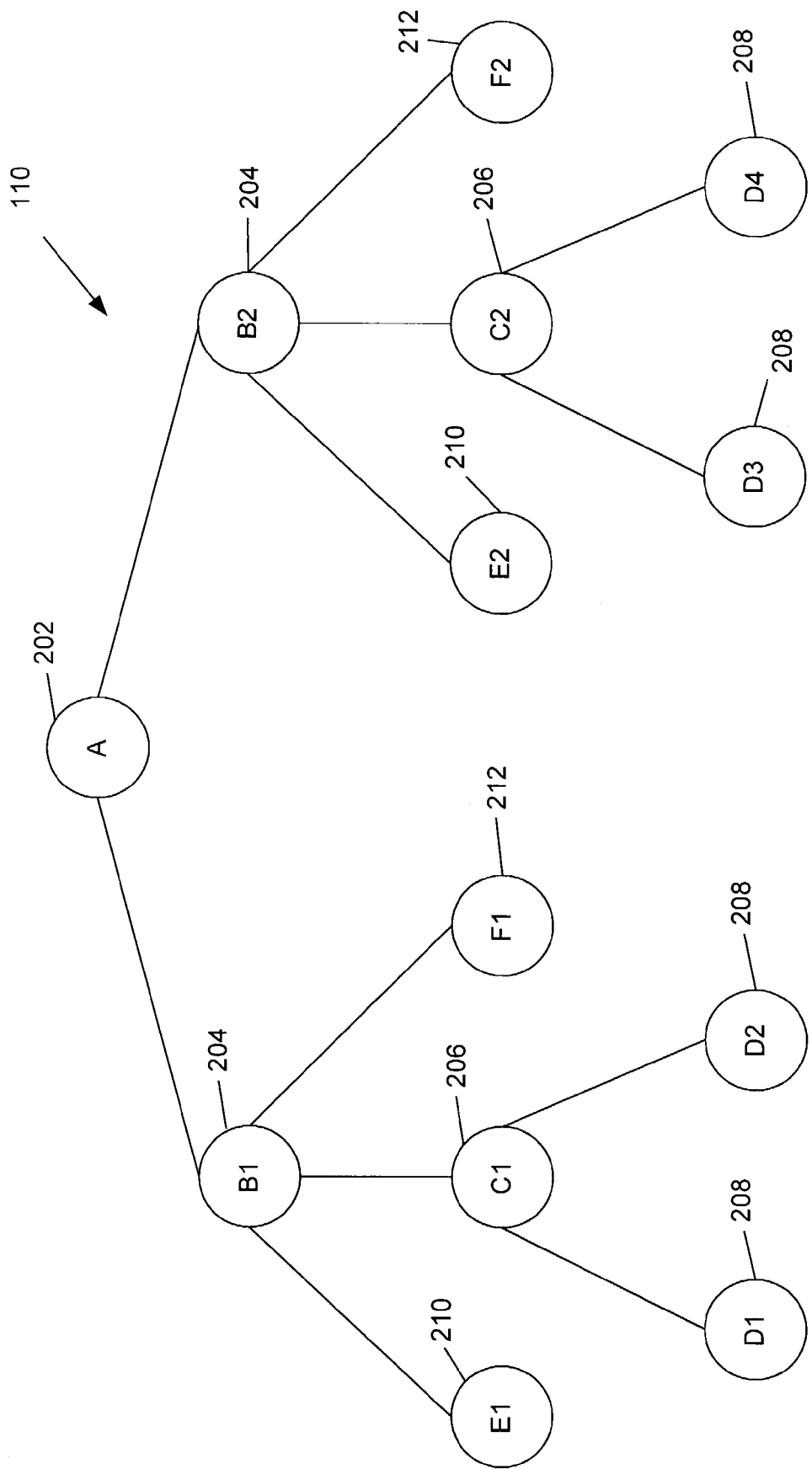
FIG. 2 is a tree diagram illustrating one of a number of possible embodiments of the hierarchical device model of FIG. 1.

FIG. 2 is a tree diagram illustrating one of a number of possible embodiments of a design strategy for a hierarchical device model 110. In general, it should be appreciated that hierarchical model 110 comprises at least one low-level component or block (i.e., child block) and at least one high-level component containing the child block (i.e., a parent block). Therefore, hierarchical device model 110 may be viewed as a tree structure representation of the corresponding DUT 106.

As known in the art, a tree structure is a type of data structure in which each data element (e.g., component, block, node, etc.) may be logically connected to one or more elements directly beneath it. A higher-level data element may have one or more lower-level data elements, referred to as children. In this regard, hierarchical device model 110 comprises one or more parent blocks, each of which may have one or more child blocks. It should be appreciated that the tree structure may be balanced, unbalanced, symmetrical, asymmetrical, etc. In this manner, each child block and parent block in hierarchical device model 110 may be viewed as an independent integrated circuit. As described in more detail below, hierarchically-controlled test pattern generation module 100 may leverage the hierarchical nature of device model 110 to improve ATPG processing.

For purposes of illustration, a simple example of an embodiment of hierarchical device model 110 is illustrated in FIG. 2. In this example, hierarchical device model 110 comprises a plurality of components—block A 202, block B 204, block C 206, block D 208, block E 210, and block F 212—arranged in a tree structure. Block A 202, which represents the highest-level block, has two child blocks—a first instance of block B 204 (i.e., block B1) and a second instance of block B 204 (i.e., block B2). Each block B 204 comprises three child blocks—one block E 210, one block C 206, and one block F 212. For example, block B1 comprises three child blocks: block E1, block C1, and block F1. Block B2 comprises three child blocks: block E2, block C2, and block F2. Each instance of block C 206 comprises two child blocks—two instances of block D 208.

Figures 3, 4:
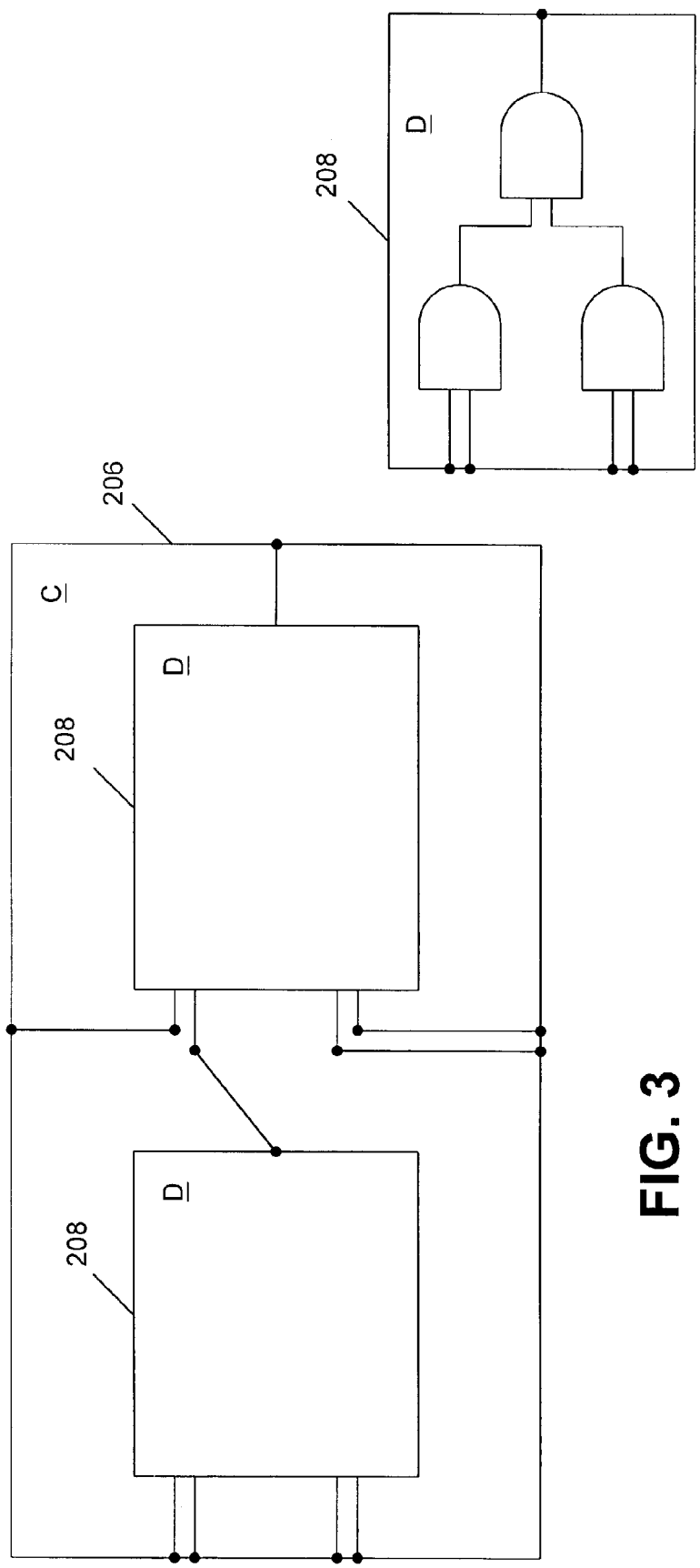
FIG. 3 is a schematic diagram of a portion of the hierarchical device model of FIG. 2.
FIG. 4 is a schematic diagram of the block D circuit of FIG. 3.

FIGS. 3 and 4 are schematic diagrams illustrating the same hierarchical concept for block C 206. For instance, block C 206 may comprise a block having seven inputs and one output. As illustrated in FIG. 3, block C 206 may comprise two instances of block D 208, which may comprise, for example, two AND gates driving a third AND gate.

Referring again to FIG. 1, ATPG system 108 may comprise a hierarchical device model 110, a fault model 112, a hierarchically-controlled test pattern generation module 100 according to the present invention, and automatic test pattern generation (ATPG) algorithms 114. The architecture, operation, and/or functionality of several embodiments of hierarchically-controlled test pattern generation module 100 will be described in detail with respect to FIG. 7. However, by way of introduction, the general architecture, operation, and/or functionality will be briefly described with reference to FIG. 1.

In general, hierarchically-controlled test pattern generation module 100 leverages the hierarchy embedded in device model(s) 110 to improve ATPG processes. For example, hierarchically-controlled test pattern generation module 100 may receive a hierarchical device model 110 of a DUT 106. As described above with respect to FIGS. 2–4, hierarchical device model 110 may comprise at least one parent block that contains the child block. Hierarchically-controlled pattern generation module 100 may then perform ATPG processing on the blocks in device model 110 via a post-order traversal. In a post-order traversal algorithm, ATPG processing is performed on a parent block after visiting all associated child blocks.

For example, assuming the device model 110 illustrated in FIG. 2 is being used, hierarchically-controlled test pattern generation system 100 may perform ATPG processing on the blocks of the device model 110 in the manner illustrated in Table 1 below.

TABLE 1

| Post-Order Traversal Sequence | |
| --- | --- |
| 1. | block E1 |
| 2. | block D1 |
| 3. | block D2 |
| 4. | block C1 |
| 5. | block F1 |
| 6. | block B1 |
| 7. | block E2 |
| 8. | block D3 |
| 9. | block D4 |
| 10. | block C2 |
| 11. | block F2 |
| 12. | block B2 |
| 13. | block A |

By performing ATPG processing in this manner, it will be appreciated that the hierarchy may be leveraged to improve the efficiency of ATPG algorithms 114. As known in the art, an ATPG algorithm 114 may be used to determine whether a test pattern may be generated to detect a particular fault. Typically, during ATPG processing, an ATPG algorithm 114 designates (for the entire device model) whether the particular fault may be detected (i.e., whether a test pattern can be generated to detect the fault). In this regard, an ATPG algorithm 114 typically designates a so-called fault status for each fault (e.g., "untestable fault," "undetected fault," "detected fault," etc.). For instance, if the ATPG algorithm 114 cannot generate a test pattern after all possibilities have been exhausted, the fault may be categorized as "untestable." An ATPG algorithm 114 may also implement an abort limit in order to manage processing resources. In this manner, a fault may be categorized as "undetected" if the abort limit is reached before ATPG algorithm 114 is able to resolve the fault as "detected" or "untestable." If a test pattern is generated that detects the fault, the fault may be categorized as "detected."

As stated above, existing solutions apply a flattened approach to ATPG processing. In other words, the entire model of the DUT is processed by the ATPG algorithm, thereby increasing the required ATPG processing resources. Hierarchically-controlled test pattern generation module 100, however, leverages the hierarchy of the device model(s) 110 to reduce the cost of ATPG processing.

For example, hierarchically-controlled test pattern generation module 100 may improve the process of (1) determining that a particular fault may be detected in DUT 106 and (2) the process of determining that a particular fault is untestable. By way of example, each block in device model 110 may be viewed as a separate integrated circuit, with separate primary inputs and primary outputs (PIPO). In this regard, when an ATPG algorithm 114 is run on a child block and is not allowed access to the primary inputs and primary outputs, any test pattern that is generated (to detect a particular fault) may be used at any higher level of hierarchy, which contains the child block (i.e., parent block(s)). In other words, the test pattern and the detected fault may be promoted to all higher-level blocks that contain the child block without ATPG processing being performed on the higher-level blocks. One of ordinary skill in the art will appreciate that test patterns and detected faults may be promoted to higher-level blocks because, when the ATPG algorithm 114 is not allowed access to the primary inputs and primary outputs, any generated test patterns (and corresponding detected faults) depend only on scan registers, which will always be accessible, independent of access to the primary inputs and primary outputs. Thus, any test patterns generated (and detected faults) at lower levels of the hierarchy may be propagated to all higher levels of the hierarchy without the need to execute the ATPG algorithm 114 on the higher levels.

It should be appreciated that the function of restricting access to the primary input(s) and primary output(s) may be achieved in a variety of ways. For example, one or more primary inputs may be defined as having a fixed value. Certain inputs may be known and/or required to have a fixed value during ATPG processing due to the function of the device being tested. For instance, a test mode control input or a pad drive strength compensation control input may be restricted to an appropriate fixed value. As a further example, the value of an input may be related to the value(s) of other input(s). For example, for two inputs of a block, it may be the case that, for all instances of the block in the device, the logic at higher levels of hierarchy will never cause both inputs to be set to zero. Furthermore, the value of primary input(s) may be defined as an unknown value. For instance, certain inputs of a block might be set to multiple values and, therefore, not guaranteed to remain fixed. If the ATPG algorithm is not allowed to control these inputs, then defining their values as unknown allows the ATPG algorithm to take this uncertainty into account.

Hierarchically-controlled test pattern generation module 100 may also leverage the hierarchy of device model(s) 110 to promote untestable faults. In this regard, when an ATPG algorithm 114 is run on a low-level block (i.e., child block) and is allowed full access to the primary inputs and primary outputs, any untestable faults will always be untestable at higher levels of hierarchy that contain the low-level block (i.e., parent block(s)). One of ordinary skill in the art will appreciate that, as low-level design components become embedded in higher-level components, faults will never become easier to test and will most likely become more difficult to test. Thus, faults designated as "untestable" by an ATPG algorithm 114 at a low-level of the hierarchy may be designated as "untestable" at all higher levels of the hierarchy without re-executing the ATPG algorithm 114. It will be appreciated that hierarchically-controlled test pattern generation module 100 may be configured to implement any type of fault model. For example, fault model(s) 112 may incorporate any of the following, or other, fault models: single stuck-at fault; bridging fault; path delay, transition fault, IDDQ, etc.

Figure 5:
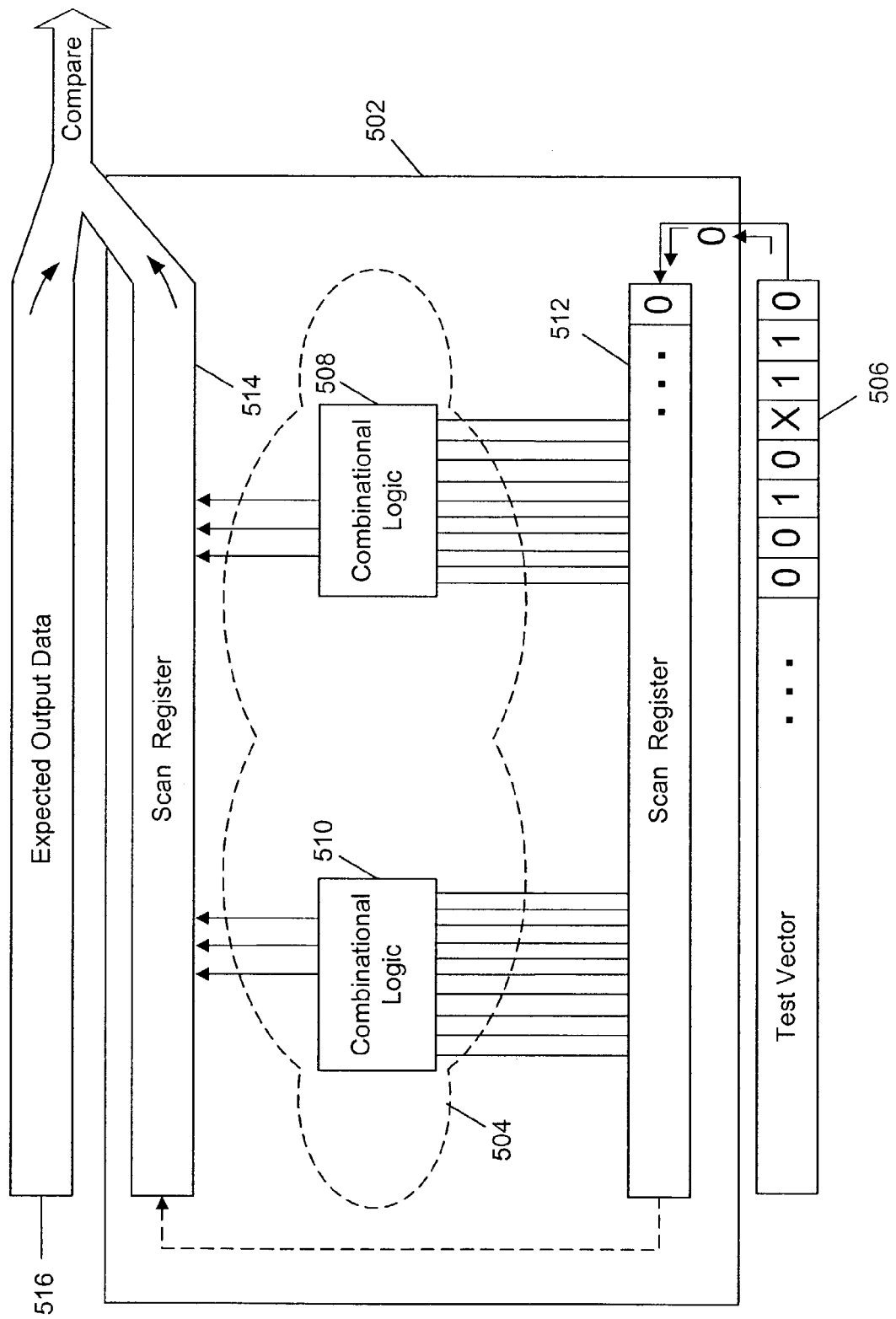
FIG. 5 is a block diagram illustrating an exemplary testing environment, in which the hierarchically-controlled test pattern generation module of FIG. 1 may be implemented.

It will be further appreciated that hierarchically-controlled test pattern generation module 100 may be implemented in a variety of testing environments. For example, as stated above, hierarchically-controlled test pattern generation module 100 may be used to generate test patterns for DUTs 106 comprising combinational logic, sequential logic, and any combination thereof. Referring now to FIG. 5, a block diagram is shown that illustrates a scan-type testing environment. As known in the art, broadside testing operates by applying test signals to the input pins of integrated circuit chips, and monitoring the output generated on output pins of that same chip. Due to the density of functional circuitry now provided on integrated circuit chips, scan-type testing is employed. To more specifically describe scan-type testing, if testing hardware has access only to the input and output pins of an integrated circuit chip, then the operation of the vast majority of the circuitry of most integrated circuit chips cannot practically be tested directly. Scan-type testing is achieved by providing specialized circuitry integrated within the integrated circuit chip to be tested that allows test inputs to be propagated into the chip for testing the functional logic thereof, and test outputs to be acquired.

Scan chains or scan registers are utilized in this fashion. For example, and in reference to FIG. 5, a DUT 106 (e.g., an integrated circuit chip 502) may include functional circuitry 504 (which may comprise both sequential and combinational logic) that is provided on board the integrated circuit chip 502. A test vector 506 contains a plurality of bits that define the test input and output. As is known, the bits of the test vector 506 are generally set to values of either 1 or 0, but some may be don't care values (e.g., "X"). Often, the test vector 506 is rather lengthy, and may comprise several hundred, or even several thousand, bits. These bit values are then shifted serially into the integrated circuit chip 502 where they may be used to test combinational logic 508 and 510, which may be embedded deep within the integrated circuit chip 502. In this regard, the bit positions of the test vector 506 are shifted into a scan register 512. The scan register 512 is illustrated in the drawing as a single register. However, and as is known, the register may comprise a plurality of scan chains, which are individual registers or serial bit positions within the chip. Consistent with the terminology used herein, the collection of all the scan chains comprise a scan register. For purposes of simplicity and illustration, only one scan chain has been illustrated in FIG. 5.

In similar fashion, an output scan register 514 may be provided in connection with an output vector register 516. In operation (conceptually), the bits of the test vector 506 are shifted into the scan register 512. The various bit positions of the scan register 312 are input to combinational logic sections 508 and 510 of the integrated circuit 502. Once the entire test vector 506 has been shifted into the scan register 512, the outputs of the combinational logic sections 508 and 510 may be captured by the output scan register 514, then shifted out to an output register 516 where the values are compared against predefined expected data values. This concept is illustrated graphically by the "Compare" arrow.

It should be appreciated that the input scan register 512 and output scan register 514 have been illustrated as such merely to simplify the discussion herein. In practice, each bit position of a scan chain may be both an input and an output. That is, a test vector may be clocked into the chip via an input scan chain. Then, once the entire test vector is clocked into the chip, the functional circuitry to be tested may be tested (by the vector), and the scan register may again be clocked to capture output values. At this time, the same scan chain/register may be viewed as an output scan register 514, and its value may be clocked out of the chip, where it is compared against an expected value for that register. Dashed lines coupling the two illustrated registers 514 and 516 depict this concept of register continuity and bi-directionality.

Figure 6:
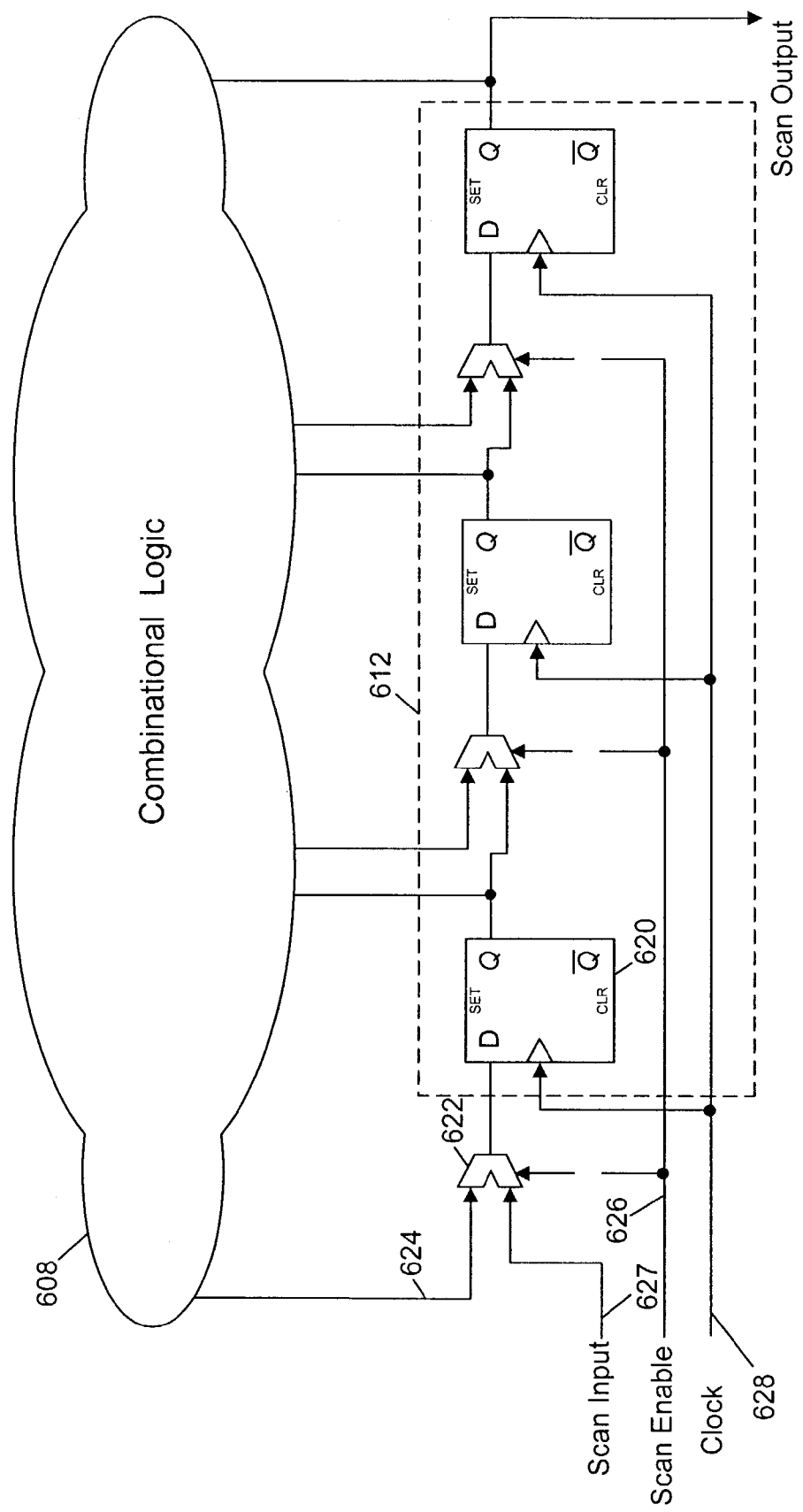
FIG. 6 is a diagram illustrating components of an exemplary DUT.
Figure 7:
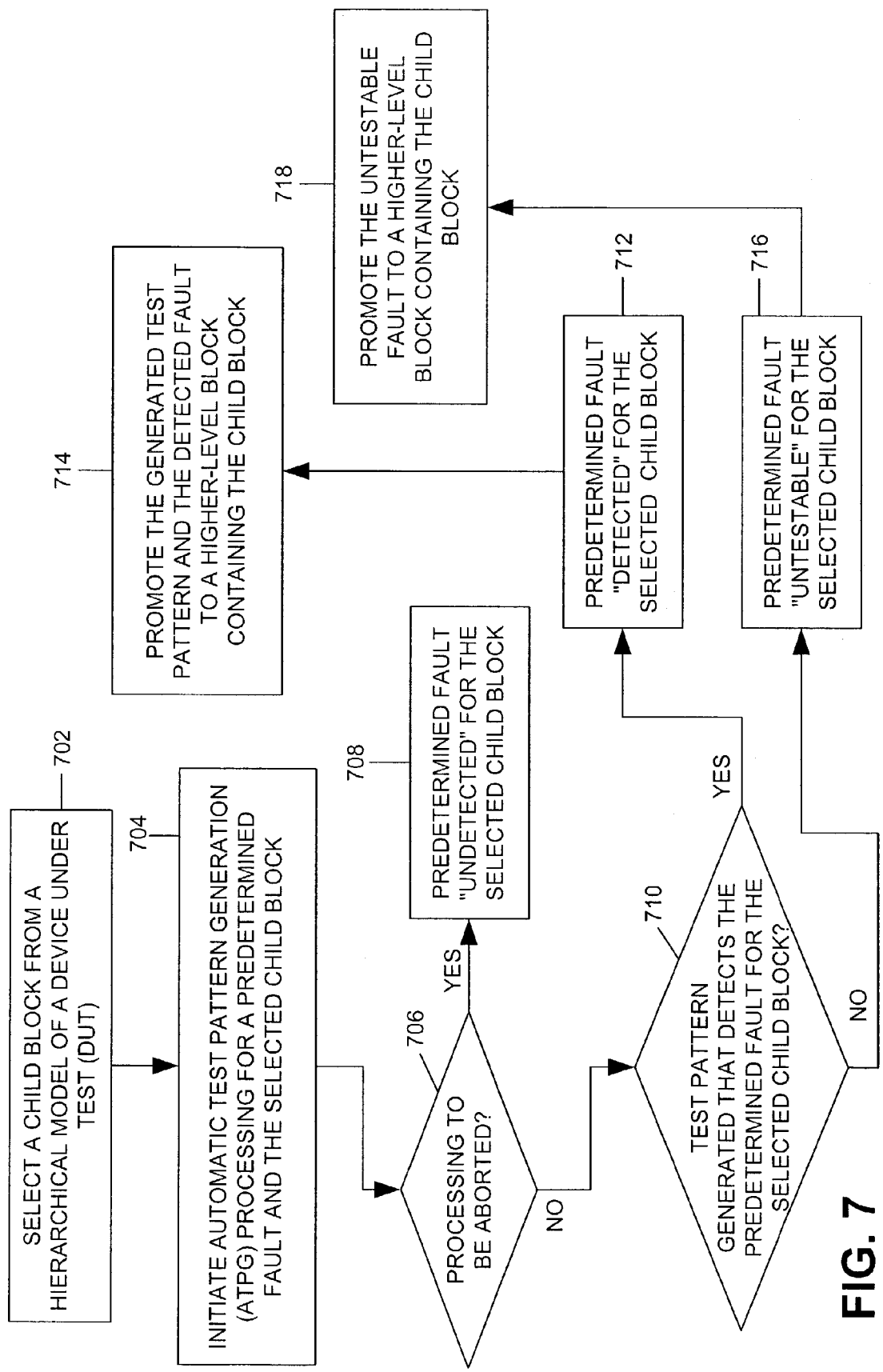
FIG. 7 is a flow chart illustrating the architecture, functionality, and/or operation of an embodiment of the hierarchically-controlled test pattern generation module of FIG. 1.
Figure 8:
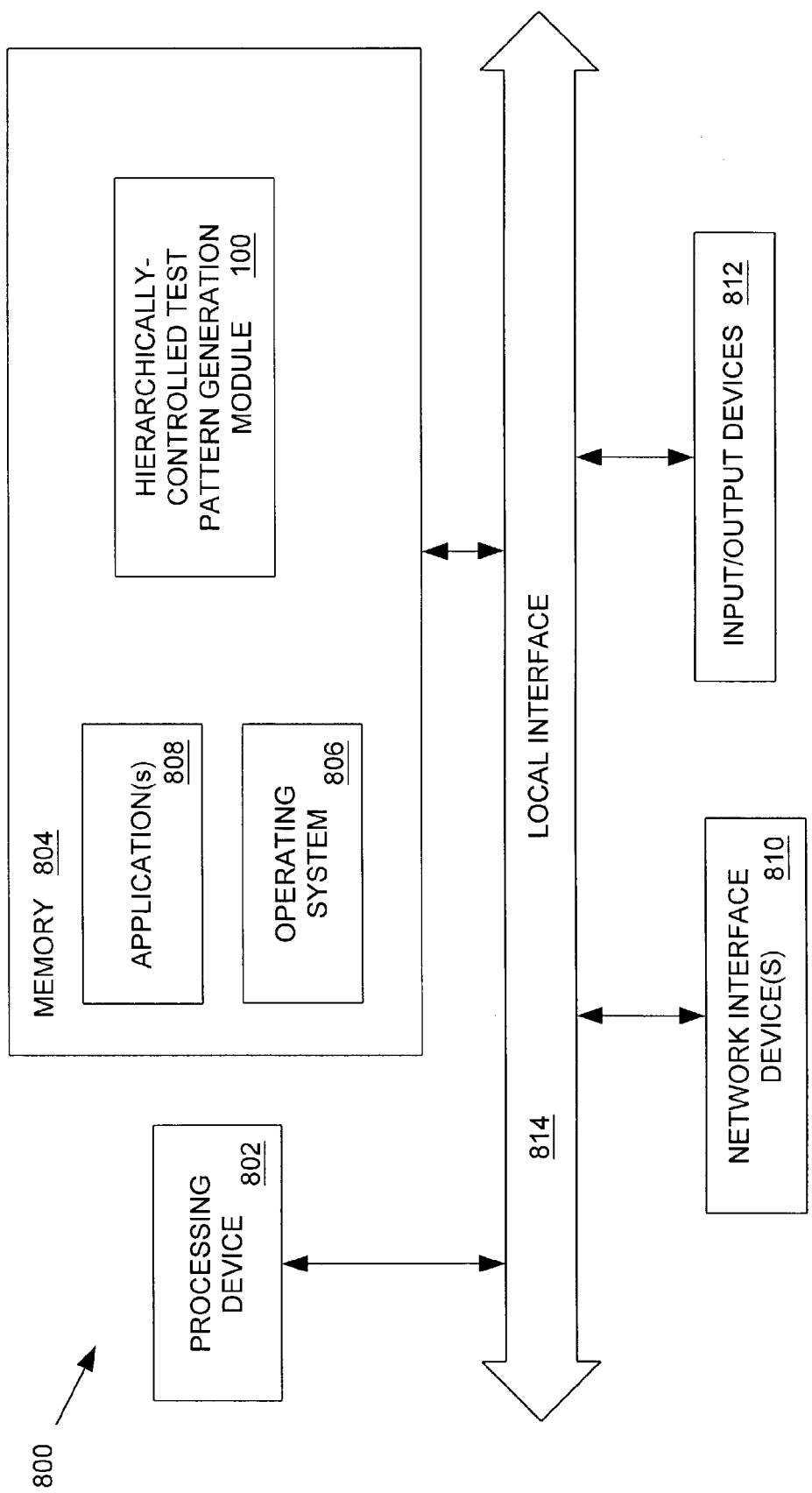
FIG. 8 is a block diagram of a computing system for implementing an embodiment of the hierarchically-controlled test pattern generation module of FIGS. 1 and 7.

It will be appreciated that the diagram of FIG. 5 has been presented purely for purposes of illustration and, in light of the discussion that follows in connection with FIGS. 6–8, a better understanding of the alternative embodiments will be appreciated. It should be appreciated from FIG. 5, however, that by utilizing scan chains (or a scan register) bits of a test vector may be propagated into and out of an integrated circuit chip 502 to allow direct testing of functional logic that may be buried deep within the integrated circuit chip 502, and thus not directly accessible or testable by the pins of the integrated circuit chip 502.

Reference is now made to FIG. 6, which illustrates an alternative implementation of the scan chains and scan register. In this regard, instead of providing a separate register to comprise the scan register 512, typically sequential logic already embedded within the circuit chip is utilized. For example, and again for purposes of illustration, assume flip flops (e.g., 620) are provided in a integrated circuit chip, and are functionally configured to operate in a certain manner. Test vector values may be shifted into these registers via, for example, multiplexers 622. In this regard, a multiplexer 622 may have 2 inputs: one for receiving an input from the functional logic 624 provided on the chip, and one for receiving input values from a scan input 627 provided in connection with the testing configuration of the chip. A scan enable line 626 may be provided as a multiplexer select, to select which of the two inputs is routed through the multiplexer 622 to the flip flop 620. Once the various bit values of the test vector 506 have been shifted into the scan chain 612, the scan enable line 626 may be set to propagate the appropriate bit values of the scan chain 612 to the various sequential circuit devices (e.g., 620). As will be understood, a clock line (denoted as scan clock) 628 may be toggled to clock in the various bit values through the respective sequential circuit components comprising the scan chain (or scan register) 612. In this way, the various outputs of the sequential circuit components may be controllably set in order to test the combinational logic 608 of the integrated circuit chip. In this regard, it is assumed that the functional logic of an integrated circuit chip will comprise a combination of sequential and combinational logic, which may be organized in various layers (e.g, a layer of sequential logic, then a layer of combinational logic, then a layer of sequential logic, another layer of combinational logic, etc.). Any given "layer" of combinational logic may be tested by controlling the values directed to the inputs of that combinational logic, in a manner described above and illustrated in connection with FIG. 5, and observing its outputs. The outputs of the combinational logic components may then be directed to one or more output scan chains, which then may be shifted serially out of the integrated circuit chip for evaluation by the testing equipment. In this regard, and as illustrated in FIG. 5, a separate output scan register may be formed within the chip, or alternatively, the output scan chain utilize the same sequential registers as the input scan chain.

By way of clarification, and as will be understood, the broad concepts and teachings of the present invention apply to sequential circuitry as well as combination logic. Furthermore, the concepts of the present invention may also apply to analog circuitry, in certain situations. For example, when the analog circuitry is configured in a logic-like fashion (e.g., comparators).

Having described the various embodiments for automatic testing environment 102, the architecture, operation, and/or functionality of another embodiment of hierarchically-controlled test pattern generation module 100 will be described with respect to FIGS. 7–8. As stated above, hierarchically-controlled test pattern generation module 100 leverages the hierarchy embedded in device model(s) 110 to improve ATPG processes. In this regard, hierarchically-controlled test pattern generation module 100 may interface with hierarchical device model(s) 110, fault model(s) 112, and ATPG algorithm(s) 114 to control the manner in which each component is used to detect faults for blocks (i.e., determine whether a particular fault may be detected by a test pattern).

As mentioned above, hierarchically-controlled test pattern generator module 100 may be used to improve ATPG processing for detected faults (and corresponding test patterns), as well as untestable faults. FIG. 7 is a flow chart illustrating the architecture, operation, and/or functionality of one of a number of possible embodiments of hierarchically-controlled test pattern generator module 100. At block 702, hierarchically-controlled test pattern generation module 100 may select a child block from a hierarchical device model 110 of a DUT 106 to be processed via an ATPG algorithm 114. As known in the art, an ATPG algorithm 114 may be used to determine whether a particular fault being tested may be detected by a test pattern for a particular block in device hierarchical device model 110. Thus, hierarchically-controlled test pattern generation module 100 may also interface with a fault model 112 to select a particular fault to detect (e.g., single stuck-at fault, bridging fault, path delay, etc.) in the selected child block. It should be mentioned again that the block may be configured in a variety of ways. Referring to the exemplary embodiment in FIGS. 2–4, hierarchically-controlled test pattern generation module 100 may select a design component D 208.

Referring again to FIG. 7, at block 704, hierarchically-controlled test pattern generation module 100 may initiate ATPG processing for a predetermined and/or selected fault and the selected child block. Hierarchically-controlled test pattern generation module 100 may be configured to initiate an ATPG algorithm 114. In alternative embodiments, hierarchically-controlled test pattern generation module 100 may include the logic associated with the ATPG algorithm 114. Regardless of the particular configuration, it should be appreciated that during ATPG processing an ATPG algorithm 114 determines whether the fault being tested may be detected in the selected child block. (i.e., whether a test pattern can be generated). In this regard, as mentioned above, an ATPG algorithm 114 typically designates a so-called fault status for the fault in the design component being tested (e.g., "untestable fault," "undetected fault," "detected fault," etc.). For instance, if the ATPG algorithm 114 cannot generate a test pattern after all possibilities have been exhausted, the fault may be categorized as "untestable" for the particular design component. An ATPG algorithm 114 may also implement an abort limit in order to manage processing resources. In this manner, a fault may be categorized as "undetected" if the abort time limit is reached before ATPG algorithm 114 is able to resolve the fault as "detected" or "untestable." If a test pattern is generated, the fault may be categorized as "detected."

In this regard, at decision block 706, hierarchically-controlled test pattern generation module 100 may determine whether ATPG processing is to be aborted. Due to the complexities of the underlying DUT 106, hierarchical device model 110, and fault model 112, ATPG processing may consume a large amount of processing time, resources, etc. Thus, it may be advantageous in certain circumstances to designate an abort limit for detecting the fault. In other words, hierarchically-controlled test pattern generation module 100 may be configured to abort after a predetermined amount of time if the fault is not detected for the selected design component. As illustrated at block 708, if ATPG processing is to be aborted, hierarchically-controlled test pattern generation module 100 may designate the fault "undetected" for the selected child block. Then, hierarchically-controlled test pattern generation module 100 may follow the rules for post-order traversal and select another block.

If ATPG processing is not to be aborted, at decision block 710, hierarchically-controlled test pattern generation module 100 may determine whether a test pattern is generated to detect the fault for the selected child block. By way of example, hierarchically-controlled test pattern generation module 100 may monitor the execution of the ATPG algorithm 114 via function call(s), an application programming interface (API), etc. Alternatively, the ATPG algorithm 114 may notify hierarchically-controlled test pattern generation module 100 when a test pattern is generated that detects the fault. If hierarchically-controlled test pattern generation module 100 determines that a test pattern has been generated that detects the fault, at block 712, hierarchically-controlled test pattern generation module 100 may designate the fault "detected" for the selected child block. As briefly stated above, hierarchically-controlled test pattern generation module 100 may be configured to leverage the hierarchy of the device model(s) 110 to reduce the cost of ATPG processing.

Therefore, at block 714, hierarchically-controlled test pattern generation module 100 may promote the detected fault and the generated test patter to a higher-level block that contains the selected child block without performing ATPG processing on the higher-level block. By way of example, consider the situation above, where the selected child block is block D1, which comprises two AND gates driving a third AND gate. Further assume that a test pattern is generated for the block D1. Hierarchically-controlled test pattern generation module 100 may then promote the detected fault to higher-level design components that contain block D1 (e.g., higher-level block C1).

Block D 208 and block C 206 may be viewed as separate circuit elements, each having separate primary inputs and primary outputs (PIPO). In this regard, one of ordinary skill in the art will appreciate that, when an ATPG algorithm 114 is run on a given lower-level block (e.g., block D1) and is not allowed access to the primary inputs and primary outputs, any test pattern that is generated (and the fault it detects) may be used at any higher level of hierarchy (e.g., block C1), which contains the lower-level block. In other words, the test pattern and the detected fault may be promoted to all higher-level blocks that contain the lower-level block without ATPG processing being performed on the higher-level blocks. One of ordinary skill in the art will further appreciate that test patterns and detected faults may be promoted to higher-level blocks because, when the ATPG algorithm 114 is not allowed access to the primary inputs and primary outputs, any generated test patterns (and corresponding faults) depend only on scan registers, which will always be accessible, independent of access to the primary inputs and primary outputs. Thus, any test patterns generated (and detected faults) at lower levels of the hierarchy may be propagated to all higher levels of the hierarchy without the need to execute the ATPG algorithm 114 on the higher levels. Accordingly, it should be appreciated that, at block 704, hierarchically-controlled test pattern generation module 100 may be further configured to restrict access to at least one primary input and at least one primary output. As stated above, hierarchically-controlled test pattern generator module 100 may be configured in a variety of ways to restrict access to the primary input(s) and primary output(s). One or more primary inputs may be defined as having a fixed value. In addition, the value of a data input, for example, may be defined as being related to value(s) of other data input(s). Furthermore, the value of a data input may be defined as an unknown. One of ordinary skill in the art will appreciate that additional methods for restricting access to the primary input(s) and output(s) may be employed.

As illustrated at blocks 716 and 718, hierarchically-controlled test pattern generation module 100 may also promote untestable faults. In this regard, when an ATPG algorithm 114 is run on a low-level block and is allowed full access to the primary inputs and primary outputs, any untestable faults will always be untestable at higher levels of hierarchy that contain the low-level block. One of ordinary skill in the art will appreciate that, as low-level blocks become embedded in higher-level blocks, faults will never become easier to test and will most likely become more difficult to test. Thus, faults designated as "untestable" by an ATPG algorithm 114 at a low-level of the hierarchy may be designated as "untestable" at all higher levels of the hierarchy without re-executing the ATPG algorithm 114.

It will be appreciated that ATPG system 108 and hierarchically-controlled test pattern generation module 100 may be implemented in hardware, software, firmware, and any combination thereof. Therefore, it should be appreciated that the flow chart of FIG. 7 shows the architecture, functionality, and/or operation of a possible implementation of hierarchically-controlled test pattern generation module 100. In this regard, each block represents a module, segment, or portion of code, which comprises one or more executable instructions for implementing the specified logical function(s). It should also be noted that in some alternative implementations, the functions noted in the blocks may occur out of the order noted in FIG. 7. For example, two blocks shown in succession in FIG. 7 may in fact be executed substantially concurrently or the blocks may sometimes be executed in the reverse order, depending upon the functionality involved, as will be further clarified hereinbelow.

FIG. 8 is a block diagram of a computing system 800 for implementing an embodiment of the hierarchically-controlled test pattern generation module of FIGS. 1 and 7. When hierarchically-controlled test pattern generation module 100 is implemented in software, as is shown in FIG. 7, it should be noted that hierarchically-controlled test pattern generation module 100 may be stored on any computer-readable medium for use by or in connection with any computer-related system or method. In the context of this document, a computer-readable medium is an electronic, magnetic, optical, or other physical device or means that can contain or store a computer program for use by or in connection with a computer-related system or method. The hierarchically-controlled test pattern generation module 100 may be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can store, communicate, propagate, or transport the program for use by or in connection with the instruction execution system, apparatus, or device.

The computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM, EEPROM, or Flash memory) (electronic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

In an alternative embodiment, where hierarchically-controlled test pattern generation module 100 is implemented in hardware, it may be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

In terms of hardware architecture, as shown in FIG. 8, computing system 800 includes a processor 802, memory 804, network interface device(s) 810, and input and/or output (I/O) device(s) 812 that are in communication with each other via local interface 814. Local interface 814 can be, for example but not limited to, one or more buses or other wired or wireless connections, as is known in the art. The local interface 814 may have additional elements, which are omitted for simplicity, such as controllers, buffers (caches), drivers, repeaters, and receivers, to enable communications. Further, the local interface may include address, control, and/or data connections to enable appropriate communications among the aforementioned components.

The processor 802 is a hardware device for executing software, particularly that stored in memory 804. The processor 802 can be any custom made or commercially available processor, a central processing unit (CPU), an auxiliary processor among several processors associated with computing system 800, a semiconductor based microprocessor (in the form of a microchip or chip set), a macroprocessor, or generally any device for executing software instructions. Examples of suitable commercially available microprocessors are as follows: a PA-RISC series microprocessor from Hewlett-Packard Company, an 80x86 or Pentium series microprocessor from Intel Corporation, a PowerPC microprocessor from IBM, a Sparc microprocessor from Sun Microsystems, Inc, or a 68xxx series microprocessor from Motorola Corporation.

Memory 804 may include any one or combination of volatile memory elements (e.g., random access memory (RAM, such as DRAM, SRAM, SDRAM, etc.)) and nonvolatile memory elements (e.g., ROM, hard drive, tape, CDROM, etc.). Moreover, the memory 804 may incorporate electronic, magnetic, optical, and/or other types of storage media. Note that the memory 804 can have a distributed architecture, where various components are situated remote from one another, but can be accessed by the processor 802.

The software in memory 804 may include one or more separate programs, each of which comprises an ordered listing of executable instructions for implementing logical functions. In the example of FIG. 8, the software in the memory 804 includes hierarchically-controlled test pattern generation module 100 in accordance with the present invention, a suitable operating system (O/S) 806, and application(s) 808. A nonexhaustive list of examples of suitable commercially available operating systems 806 is as follows: (a) a Windows operating system available from Microsoft Corporation; (b) a Netware operating system available from Novell, Inc.; (c) a Macintosh operating system available from Apple Computer, Inc.; (e) a UNIX operating system, which is available for purchase from many vendors, such as the Hewlett-Packard Company, Sun Microsystems, Inc., and AT&T Corporation; (d) a LINUX operating system, which is open source software that is readily available on the Internet; (e) a run time Vxworks operating system from WindRiver Systems, Inc.; or (f) an appliance-based operating system, such as that implemented in handheld computers or personal data assistants (PDAs) (e.g., PalmOS available from Palm Computing, Inc., and Windows CE available from Microsoft Corporation). The operating system 806 essentially controls the execution of other computer programs, such as hierarchically-controlled test pattern generation module 100, and provides scheduling, input-output control, file and data management, memory management, and communication control and related services.

It will be appreciated that hierarchically-controlled test pattern generation module 100 may be a source program, executable program (object code), script, or any other entity comprising a set of instructions to be performed. When a source program, then the program needs to be translated via a compiler, assembler, interpreter, or the like, which may or may not be included within the memory 804, so as to operate properly in connection with the O/S 806. Furthermore, hierarchically-controlled test pattern generation module 100 may be written as (a) an object oriented programming language, which has classes of data and methods, or (b) a procedure programming language, which has routines, sub-routines, and/or functions, for example but not limited to, C, C++, Pascal, Basic, Fortran, Cobol, Perl, Java, and Ada.

I/O 812 may include input devices, for example but not limited to, a keyboard, mouse, scanner, microphone, etc. Furthermore, the I/O devices 812 may also include output devices, for example but not limited to, a printer, display, etc. Network interface devices 810 may comprise the various components used to transmit and/or receive data over a network. By way of example, the network interface devices 810 may include a device that can communicate both inputs and outputs, for instance, a modulator/demodulator (e.g., modem), wireless (e.g., radio frequency (RF)) transceiver, a telephonic interface, a bridge, a router, network card, etc.

While particular embodiments of the invention have been disclosed in detail in the foregoing description and drawings for purposes of example, it will be understood by those skilled in the art that variations and modifications thereof can be made without departing from the scope of the invention as set forth in the following claims.

Therefore, having thus described the invention, at least the following is claimed:

1. A method for automatically generating test patterns for testing a device under test, the method comprising the steps of:

receiving a hierarchical model of a device under test, the hierarchical model comprising at least one child block and at least one parent block which contains the child block; and performing an automatic test pattern generation (ATPG) process on the at least one child block and the at least one parent block via a post-order traversal of the hierarchical model.

2. The method of claim 1, wherein the step of performing an automatic test pattern generation (ATPG) process on the at least one child block and the at least one parent block via a post-order traversal of the hierarchical model comprises incorporating the result of the ATPG process on the at least one child block when performing the ATPG process on the at least one parent block.

3. The method of claim 1, wherein the step of performing an ATPG process comprises the steps of:

generating a test pattern that detects at least one fault for the at least one child block;

designating the at least one fault as detected; and promoting the at least one fault and the test pattern to the parent block containing the at least one child block.

4. The method of claim 3, wherein the step of performing an ATPG process comprises restricting access to at least one primary input and at least one primary output of the at least one child block.

5. The method of claim 4, wherein the restricting access comprises defining a fixed value for at least one primary input.

6. The method of claim 3, wherein the step of generating a test pattern that detects at least one fault is based only on scan registers.

7. The method of claim 1, wherein the step of performing an ATPG process comprises the steps of:

determining that a fault is untestable on the at least one child block; and promoting the untestable fault to the parent block containing the at least one child block.

8. The method of claim 7, wherein the step of performing an ATPG process comprises accessing all of the primary inputs and primary outputs of the at least one child block.

9. A program embodied in a computer-readable medium for automatically generating test patterns for a device under test, the program comprising:

logic configured to access a hierarchical model of a device under test, the hierarchical model comprising at least one child block and at least one parent block which contains the child block; and logic configured to initiate an automatic test pattern generation (ATPG) process on the at least one child block and the at least one parent block via a post-order traversal of the hierarchical model.

10. The program of claim 9, wherein the logic configured to initiate an ATPG process comprises logic configured to incorporate the result of the ATPG process on the at least one child block when performing the ATPG process on the at least one parent block.

11. The program of claim 9, wherein the logic configured to initiate an ATPG process comprises:

logic configured to generate a test pattern that detects at least one fault for the at least one child block;

logic configured to designate the at least one fault as detected; and logic configured to promote the at least one fault and the test pattern to the parent block containing the at least one child block.

12. The program of claim 11, wherein the logic configured to initiate an ATPG process comprises logic configured to prevent the ATPG process from accessing at least one primary input and at least one primary output of the at least one child block.

13. The program of claim 12, wherein the logic configured to prevent the ATPG process from accessing at least one primary input and at least one primary output comprises logic configured to define the value of at least one primary input as unknown.

14. The program of claim 11, wherein the logic configured to generate a test pattern that detects at least one fault further comprises logic configured to generate the test pattern based only on scan registers.

15. The program of claim 9, wherein the logic configured to initiate an ATPG process comprises:

logic configured to determine that a fault is untestable on the at least one child block; and logic configured to promote the untestable fault to the parent block containing the at least one child block.

16. The program of claim 15, wherein the logic configured to initiate an ATPG process comprises logic configured to enable the ATPG process to access all of the primary inputs and primary outputs of the at least one child block.

17. The program of claim 15, further comprising the hierarchical model.

18. The program of claim 15, further comprising the logic for performing the ATPG process.

19. An automatic test pattern generation system comprising:

a memory containing a hierarchical model of a device under test, the hierarchical model comprising at least one child block and at least one parent block which contains the child block; and a processor device configured to perform an automatic test pattern generation (ATPG) process on the at least one child block and the at least one parent block via a post-order traversal of the hierarchical model.

20. The automatic test pattern generation system of claim 19, wherein the processor device is further configured to incorporate the result of the ATPG process on the at least one child block when performing the ATPG process on the at least one parent block.

21. The automatic test pattern generation system of claim 19, wherein the processor device is further configured to:

generate a test pattern that detects at least one fault for the at least one child block;

designate the at least one fault as detected; and promote the at least one fault and the test pattern to the parent block containing the at least one child block.

22. The automatic test pattern generation system of claim 21, wherein the processor device is further configured to prevent the ATPG process from accessing at least one primary input and at least one primary output of the at least one child block.

23. The automatic test pattern generation system of claim 22, wherein the processor is further configured to prevent the ATPG process from accessing at least one primary input and at least one primary output by at least one of the following:

fixing the value of at least one primary input; and defining at least one primary input to an unknown value.

24. The automatic test pattern generation system of claim 21, wherein the processor device is further configured to generate the test pattern based only on scan registers.

25. The automatic test pattern generation system of claim 19, wherein the processor device is further configured to:

determine that a fault is untestable on the at least one child block; and promote the untestable fault to the parent block containing the at least one child block.

26. The automatic test pattern generation system of claim 25, wherein the processor device is further configured to enable the ATPG process to access all of the primary inputs and primary outputs of the at least one child block.

27. An automatic test pattern generation system comprising:

means for storing a hierarchical model of a device under test, the hierarchical model comprising at least one child block and at least one parent block which contains the child block; and means for performing an automatic test pattern generation (ATPG) process on the at least one child block and the at least one parent block via a post-order traversal of the hierarchical model.

* * * * *